(12) United States Patent
Bando et al.

(10) Patent No.: US 7,403,036 B2
(45) Date of Patent: Jul. 22, 2008

(54) INTERFACE CIRCUIT

(75) Inventors: Kazuhiko Bando, Tokyo (JP);
Masanori Inazumi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 101 days.

(21) Appl. No.: 11/342,881

(22) Filed: Jan. 31, 2006

(65) Prior Publication Data

US 2006/0214684 A1 Sep. 28, 2006

(30) Foreign Application Priority Data

Mar. 28, 2005 (JP) .............................. 2005-092304

(51) Int. Cl.
*H03K 19/00* (2006.01)
*H03K 19/02* (2006.01)
(52) U.S. Cl. ............................... 326/56; 326/57; 326/59
(58) Field of Classification Search .................... 326/56, 326/57, 59, 21, 26, 86, 87, 55
See application file for complete search history.

(56) References Cited

U.S. PATENT DOCUMENTS

| | | | |
|---|---|---|---|
| 6,051,989 A * | 4/2000 | Walck | 326/30 |
| 6,114,884 A * | 9/2000 | Kaplinsky | 327/108 |
| 6,232,678 B1 * | 5/2001 | Murata | 307/130 |
| 6,335,648 B1 * | 1/2002 | Matsushita | 327/198 |
| 6,356,115 B1 * | 3/2002 | Dabral et al. | 326/86 |
| 6,388,467 B1 * | 5/2002 | Ward et al. | 326/56 |
| 6,624,656 B1 * | 9/2003 | Fox et al. | 326/41 |
| 2003/0080774 A1 * | 5/2003 | Funaba | 326/30 |
| 2003/0112033 A1 * | 6/2003 | Sams | 326/56 |
| 2003/0151954 A1 | 8/2003 | Nagatome | |
| 2004/0212398 A1 * | 10/2004 | Kitazawa et al. | 326/57 |

FOREIGN PATENT DOCUMENTS

JP 2003-234649 8/2003

* cited by examiner

*Primary Examiner*—Rexford Barnie
*Assistant Examiner*—Dylan White
(74) *Attorney, Agent, or Firm*—Studebaker & Brackett PC; Donald R. Studebaker

(57) ABSTRACT

As a data bus control enable signal is set to "H," a PMOS turns on when a bi-directional bus is not in use (i.e., when a data bus active signal is "L"), so that the bi-directional bus is pulled down through a pull-down resistor. When the data bus control enable signal is set to "L," the PMOS turns off, thus holding the bi-directional bus in a high-impedance state. By setting the data bus control enable signal in accordance with the specifications of a peripheral device connected thereto, the state of the bi-directional bus can be arbitrarily set when it is inactive.

3 Claims, 2 Drawing Sheets

FIG. 3A
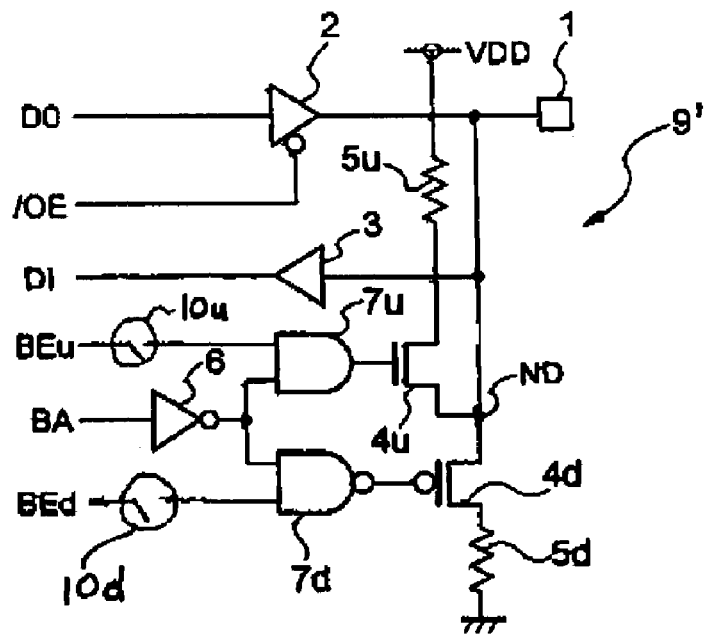
FIG. 3B
| BA | BEu | BEd | NMOS | PMOS | ND |
|----|-----|-----|------|------|-----|
| H  | —   | —   | OFF  | OFF  | —   |
| L  | L   | L   | OFF  | OFF  | Hi-Z |
| L  | H   | L   | ON   | OFF  | H   |
| L  | L   | H   | OFF  | ON   | L   |
FIG. 4
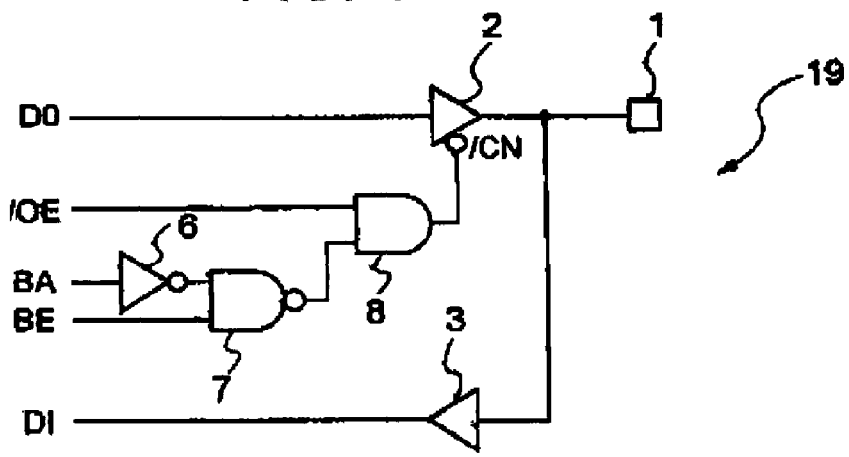

INTERFACE CIRCUIT

BACKGROUND OF THE INVENTION

1. Field of the Invention

The present invention relates to an interface circuit between a control apparatus and an input/output device, and more particularly, to a reduction in power consumption in an interface circuit of the ATA standard.

2. Description of the Related Art

FIG. 2 of the accompanying drawings is a schematic diagram of a conventional interface circuit. The interface circuit is disclosed in Japanese Patent Application Kokai (Laid-Open) No. 2003-234649.

This interface circuit is a bi-directional data bus of the ATA standard which is widely employed as an interface for connecting a control apparatus such as a computer to a peripheral device such as a hard disk drive, a CD-ROM drive and the like. While the data bus is defined to have a 16-bit width in the ATA standard, this figure shows components associated with only one of 16 bits.

In a system conforming to the ATA standard, a connection between a control apparatus 101 and a peripheral device 121 is made by connectors 111 and a cable 112. Also, the standard defines that the control apparatus 101 adds only a damping resistor 102 to a data bus on its internal board and the peripheral device 121 adds only a damping resistor 122 to the data bus on its internal board.

A controller 103 in the control apparatus 101 has a three-state buffer 105 for controlling the output of output data DO1 to a bi-directional bus 104 in accordance with an output enable signal /OE1 (where "/" means an inverse logic). The controller 103 also has a buffer 106 for fetching a signal on the bi-directional bus 104 as input data DI1. Likewise, a controller 123 in the peripheral device 121 has a three-state buffer 125 for controlling the output of output data DO2 to a bi-directional bus 124 in accordance with an output enable signal /OE2, and a buffer 126 for fetching a signal on the bi-directional bus 124 as input data DI2.

The three-state buffer 105, 125 transfers a signal at the input to the output when the output enable signal /OE1, /OE2 applied to control terminal is active (level "L"). The three-state buffer 105, 125 brings the output into a high-impedance state, i.e., a floating state, when the output enable signal /OE1, /OE2 is inactive (level "H").

In such an interface circuit, for example, when data is transferred from the control apparatus 101 to the peripheral device 121, the control apparatus 101 switches the output enable signal OE1 to an active state, and supplies data to be transferred, i.e., output data DO1, to the three-state buffer 105.

In the peripheral device 121, the output enable signal /OE2 remains in an inactive state except when data is transmitted, so that the output of the three-state buffer 125 is in a high-impedance state. Therefore, the data sent from the three-state buffer 105 of the control apparatus 101 is transferred to the bi-directional bus 124 in the peripheral device 121 through the connectors 111 and cable 112. Then, the data on the bi-directional bus 124 is introduced into the peripheral device 121 by the buffer 126 as input data DI2. When data is transferred from the peripheral device 121 to the control apparatus 101, operations reverse to the foregoing are performed.

The interface circuit described above has the following problems.

When neither the control apparatus 101 nor peripheral device 121 is outputting data, the outputs of the three-state buffers 105 and 125 are in a high-impedance state, causing the bi-directional buses 104 and 124 to enter a floating state, respectively. Thus, the input levels of the buffers 106 and 126 connected to the bi-directional buses 104 and 124 are not fixed to "H" or "L" but become close to a logical threshold voltage, causing a through current to flow. This increases consumed current.

To address this problem, one approach may be taken; data bus may be fixed to a pull-up or a pull-down state in the control apparatus. However, some peripheral devices themselves perform this pull-up or pull-down operation, so that it is not desirable to employ the above mentioned approach with all peripheral devices. For example, when the control apparatus pulls down the data bus, and a peripheral device which is pulling up the data bus is connected to the control apparatus, then extra current will flow. Also, some peripheral devices set a voltage level of signals at 5 V, while other devices set the voltage level at 3.3 V, so that the pull-up voltage cannot be uniquely determined even if the control apparatus attempts to pull up.

Another solution is to continue to drive the data bus by the control apparatus even if the data bus is not accessed. However, this is not a definite solution because some peripheral devices are performing the pull-up or pull-down operation, and the data bus may be continuously driven even when no peripheral device is accessing.

SUMMARY OF THE INVENTION

It is one object of the present invention to provide an interface circuit which is capable of setting the state of a bi-directional bus during an inactive state in accordance with the specifications of a connected peripheral device.

According to one aspect of the present invention, there is provided an improved interface circuit that includes a three-state buffer for outputting output data applied to an input thereof when an output enable signal is in an active state. This output data is sent to a bi-directional bus. The three-state buffer brings an output thereof into a high-impedance state when the output enable signal is in an inactive state. The interface circuit also includes a buffer for fetching a signal on the bi-directional bus as input data, and a resistor connected between the bi-directional bus and a ground potential or a power supply potential through a switch unit. The interface circuit also includes a logical gate for bringing the switch unit into an on-state when the bi-directional bus is enabled by a bus control signal and a bus access signal indicates that the bi-directional bus is not in use. The bus control signal is set in accordance with an output state of a separate device connected to the bi-directional bus. The logical gate brings the switch unit into an off-state when the bi-directional bus is not enabled by the bus control signal. The logical gate also brings the switch unit into an off-state when the bus access signal indicates that the bi-directional bus is in use.

As mentioned above, the resistor is connected between the bi-directional bus and the ground potential (or power supply potential) through the switch unit. The logical gate brings the switch unit into the on-state when the bi-directional bus is enabled by the setting of the bus control signal and the bus access signal indicates that the bi-directional bus is not in use. The logical gate brings the switch unit into the off-state when the bi-directional bus is not enabled by the bus control signal, and when the bus access signal indicates that the bi-directional bus is in use.

Therefore, as the bi-directional bus is set to be enabled by the bus control signal, the switch unit turns on when the bi-directional bus is not in use, so that the bi-directional bus can be pulled down (or pulled up) through the resistor. On the other hand, when the bi-directional bus is set to be disabled by the bus control signal, the switch unit turns off, so that the bi-directional bus is held in the high-impedance state. Thus, the state of the bi-directional bus, when it is inactive, can be arbitrarily set by selecting the bus control signal in accordance with the specifications of a peripheral device connected thereto.

According to a second aspect of the present invention, there is provided another interface circuit. This interface circuit includes a three-state buffer, a buffer and a logical gate. The three-state buffer outputs output data applied to an input thereof when a control signal is at a first level, to a bi-directional bus. The three-state buffer brings an output thereof into a high-impedance state when the control signal is at a second level. The buffer fetches a signal on the bi-directional bus as input data. The logical gate is provided for outputting the control signal at the first level when an output enable signal is in an active state. The logical gate also outputs the control signal at the first level when the bi-directional bus is enabled by a bus control signal and the bus access signal indicates that the bi-directional bus is not in use. The bus control signal is determined in accordance with an output state of a device connected to the bi-directional bus. The logical gate outputs the control signal at the second level when the output enable signal is in an inactive state and the bi-directional bus is not enabled by the bus control signal. The logical gate also outputs the control signal at the second level when the output enable signal is in an inactive state and the bus access signal indicates that the bi-directional bus is in use.

The above and other objects, aspects, features and advantages of the present invention will be more apparent from the following description of the preferred embodiments and appended claims when read with reference to the accompanying drawings. The drawings are simply provided for description, and do not limit the scope of the present invention.

BRIEF DESCRIPTION OF THE DRAWINGS

FIG. 3A is a schematic diagram showing an exemplary modification to the interface circuit of FIG. 1;

FIG. 3B is a table showing states of terminals in the interface circuit shown in FIG. 3A; and FIG. 4 is a schematic diagram of an interface circuit showing a second embodiment of the present invention.

DETAILED DESCRIPTION OF THE INVENTION

First Embodiment

Figure 1:
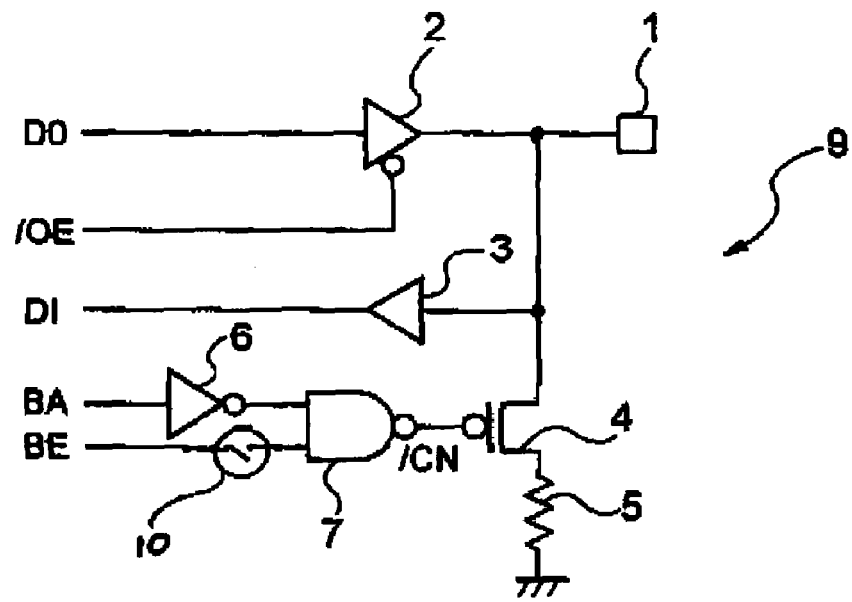
FIG. 1 is a schematic diagram of an interface circuit showing a first embodiment of the present invention.
Figure 2:
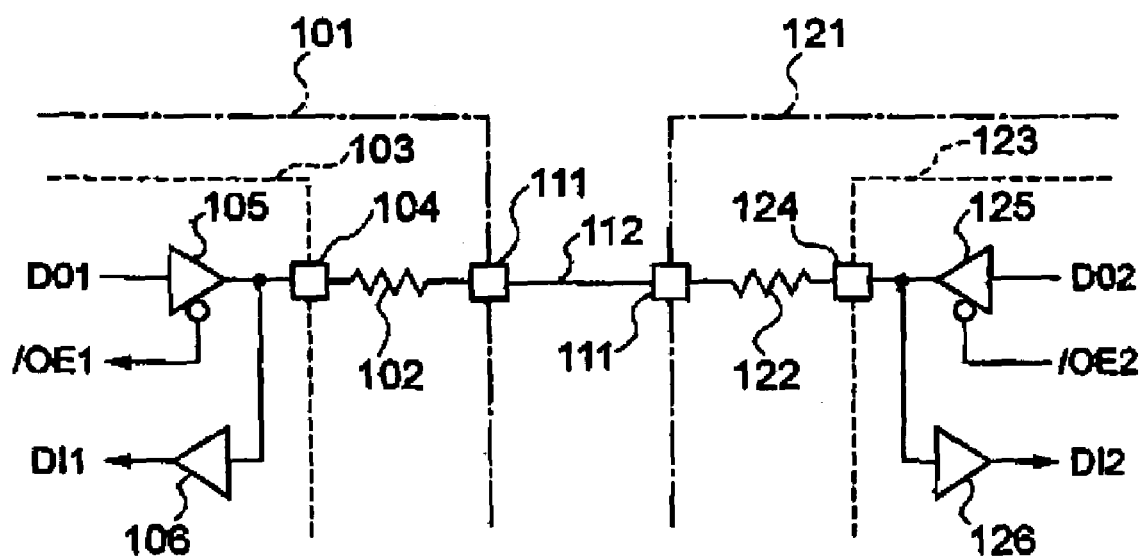
FIG. 2 is a schematic diagram showing an example of a conventional interface circuit.

Referring to FIG. 1, an interface circuit 9 of a first embodiment of the present invention will be described.

This interface circuit 9 is disposed at an end of a bi-directional data bus close to on a control apparatus for interconnecting the control apparatus and a peripheral device. The bi-directional data bus extends between the control apparatus and peripheral device. The bi-directional data bus has a width of a plurality of bits (for example, 16 bits), but FIG. 1 shows part of the interface circuit for one of these bits. The interface circuit for the remaining bits is similar in configuration.

The interface circuit 9 includes a three-state buffer 2 for controlling the output of output data DO to a bi-directional bus 1 in accordance with an output enable signal /OE. The interface circuit 9 also includes a buffer 3 for fetching a signal on the bi-directional bus 1 into the control apparatus as input data DI. A pull-down resistor 5 has one end connected to the bi-directional bus 1 through a P-channel MOS transistor (hereinafter called the "PMOS") 4. PMOS 4 is a switch unit. The pull-down resistor has the other end connected to a ground potential GND.

A logical gate for outputting a control signal /CN in accordance with a combination of logical values of a data bus active signal BA and data bus control enable signal BE is connected to a gate of the PMOS 4. The signals BA and BE are generated from the control apparatus. The data bus active signal BA is inverted by an inverter 6, and applied to one input of a two-input logical NOT AND gate (hereinafter called the "NAND") 7. The other input of the NAND 7 is applied with the data bus control enable signal BE. Then, the control signal /CN is generated from the output of the NAND 7, and applied to the gate of the PMOS 4.

The three-state buffer 2 transfers a signal at the input to the output when a signal applied to a control terminal is "L." The three-state buffer 2 brings the output into a high-impedance state when the signal applied to the control terminal is "H."

The data bus active signal BA goes to "H" when the control apparatus is performing a write or a read operation (access) to the bi-directional bus, and to "L" when the control apparatus is not accessing the bi-directional bus.

The data bus control enable signal BE is set to an enabled state ("H") or disabled state ("L") by a resister 10 in the control apparatus.

Next, the operation of the interface circuit 9 will be described.

(1) When Data Bus Control Enable Signal BE is Set to "H":

When the control apparatus accesses the bi-directional bus 1, the data bus active signal BA goes to "H," and the control signal /CN goes to "H," causing the PMOS 4 to turn off.

When the control apparatus supplies data to the bi-directional bus 1, data to be transferred is applied to the three-state buffer 2 as output data DO after the output enable signal /OE is switched to "L." As a result, the output data DO is transmitted from the three-state buffer 2 to the bi-directional bus 1. When the data to be transferred has been output, the output enable signal /OE is returned to "H." On the other hand, when the control apparatus receives data from the bi-directional bus 1, an output signal of the buffer 3 is read as input data DI while the output enable signal /OE is left unchanged at "H."

When the control apparatus is not accessing the bi-directional bus 1, the data bus active signal BA goes to "L," and the control signal /CN goes to "L," causing the PMOS 4 to turn on. As a result, the bi-directional bus 1 is connected to a ground potential GND through the PMOS 4 and pull-down resistor 5. Therefore, the bi-directional bus 1 is pulled down, and will not enter the floating state.

(2) When Data Bus Control Enable Signal BE is Set to "L":

The operation when the control apparatus accesses the bi-directional bus 1 is completely the same as the operation when the data bus control enable signal BE is set to "H."

Specifically, the data bus active signal BA goes to "H," and the control signal /CN goes to "H," causing the PMOS 4 to turn off. When the control apparatus supplies data to the bi-directional bus 1, data to be transferred is applied to the three-state buffer 2 as output data DO after the output enable signal /OE is switched to "L." As a result, the output data DO is sent from the three-state buffer 2 to the bi-directional bus 1.

When the outputting of the data to be transferred is complete, the output enable signal /OE is returned to "H." On the other hand, when the control apparatus receives data from the bi-directional bus 1, an output signal of the buffer 3 is received as input data DI while the output enable signal /OE is left unchanged at "H."

When the control apparatus is not accessing the bi-directional bus 1, the data bus active signal BA goes to "L," and the control signal /CN goes to "H," causing the PMOS 4 to turn off. Thus, the bi-directional bus 1 is not pulled down but enters the floating state.

As described above, the interface circuit 9 of the first embodiment has a switch unit (PMOS 4) and a logical gate (inverter 6 and NAND 7) for setting the state of the bi-directional bus, i.e., pull down state or floating state, when the control apparatus is not accessing, based on the data bus control enable signal BE set in the register within the control apparatus. Therefore, the state of the bi-directional bus, when it is inactive, can be set to the pull down or floating state in accordance with "H" or "L" of the data bus control enable signal BE in conformity to the specifications of a peripheral device connected to the bi-directional bus 1.

The present invention is not limited to the first embodiment described above, but can be modified in a variety of manners. Such exemplary modifications may include the followings, by way of example.

(a) Although the data bus control enable signal BE can be set by the register within the control apparatus in the first embodiment, a separate switch may be provided to manually set the data bus control enable signal BE.

(b) The logical levels of the data bus active signal BA and data bus control enable signal BE in the first embodiment are merely illustrative. Reverse logical levels may be used. The configurations of the switch unit and logical gate must be modified in accordance with the logical levels of these signals.

(c) Although the interface circuit is able to pull down the bi-directional bus 1 in the first embodiment, it may be configured to be able to pull up the bi-directional bus 1. Further, first and second data bus control enable signals may be provided such that one can be selected from among pull-up, pull-down, and floating. This modification will be described with reference to FIG. 3.

In FIG. 3, two data bus control enable signals BEu and Bed arc used such that the state of the bi-directional bus 1 during the inactive condition can be set to pull-up ("H"), a pull-down ("L"), or floating (Hi-Z) state such as via registers 10u and 10d, respectively.

The interface circuit 9' of this modification includes a switch unit, which is made up of an N-channel MOS transistor (hereinafter called the "NMOS") 4u and a PMOS 4d. The interface circuit 9' also includes a logic gate, which is made up of an inverter 6, a logical AND gate 7u and another logical NAND gate 7d. The logical AND gate 7u is referred to as "AND" and the logical NAND gate 7d is referred to as "NAND" hereinafter. The data bus control enable signals BEu and BEd are applied to first inputs of the AND 7u and NAND 7d, respectively. Second inputs of the AND 7u and NAND 7d are applied with the data bus active signal BA after it is inverted by the inverter 6. The outputs of the AND 7u and NAND 7d are connected to gates of the NMOS 4u and PMOS 4d, respectively. The NMOS 4u has a drain connected to a power supply potential VDD through a pull-up resistor 5u, and a source connected to a node ND. The node ND is connected to the bi-directional bus 1. The PMOS 4d has a drain connected to a ground potential GND through a pull-down resistor 5d, and a source connected to the node ND.

Therefore, when the data bus control enable signals BEu and BEd are both set to "L," the NMOS 4u and PMOS 4d turn off, and the node ND presents a high impedance, i.e., the bi-directional bus 1 enters a floating state, when the data bus active signal BA is inactive ("L"). When the data bus control enable signals BEu and BEd are set to "H" and "L," respectively, the node ND is at "H," i.e., the bi-directional bus 1 is pulled up. When the data bus control enable signals BEu and BEd are set to "L" and "H," respectively, the node ND is at "L," i.e., the bi-directional bus 1 is pulled down.

Second Embodiment

Referring to FIG. 4, an interface circuit 19 of a second embodiment of the present invention will be described. The elements common to those shown in FIG. 1 are designated common reference numerals and symbols.

Like the interface circuit 9 shown in FIG. 1, this interface circuit 19 is provided at an end of a bi-directional data bus close to a control apparatus for interconnecting the control apparatus and a peripheral device, and FIG. 4 shows only components for one bit within the bi-directional data bus.

This interface circuit 19 includes a three-state buffer 2 for controlling the output of output data DO to the bi-directional bus 1 in accordance with a control signal /CN. The interface circuit 19 also includes a buffer 3 for fetching a signal on the bi-directional bus 1 as input data DI. The three-state buffer 2 transfers a signal on its input to the output when the control signal /CN applied to a control terminal thereof is at "L." The three-state buffer 2 brings the output into a high-impedance state when the control signal /CN is at "H."

The control signal /CN is generated by a logical gate in accordance with a combination of logical values of an output enable signal /OE, a data bus active signal BA, and a data bus control enable signal BE issued from the control apparatus. Specifically, the data bus active signal BA is inverted by the inverter 6, and applied to one input of a two-input NAND 7. The other input of the NAND 7 is applied with the data bus control enable signal BE. The output of the NAND 7 is connected to one input of a two-input AND 8. The other input of the AND 8 is applied with the output enable signal /OE. The control signal /CN is generated from the output of the AND 8. The output enable signal /OE, data bus active signal BA, and data bus control enable signal BE are similar to those in FIG. 1.

Next, the operation of the interface circuit 19 will be described.

(1) When Data Bus Control Enable Signal BE is Set to "H":

When the output enable signal /OE is active (i.e., "L"), the control signal /CN generated from the AND 8 goes to "L" irrespective of the data bus active signal BA, so that the output data DO is supplied to the bi-directional bus 1 through the three-state buffer 2.

When the output enable signal /OE is inactive (i.e., "H"), the control signal /CN goes to "L" as long as the data bus active signal BA is "L." As a result, the output data DO is sent to the bi-directional bus 1 through the three-state buffer 2. Therefore, the bi-directional bus 1 is fixed to the "L" or "H" state in accordance with the output data DO. On the other hand, when the data bus active signal BA is "H," the control signal /CN also goes to "H." As a result, the bi-directional bus 1 enters a high-impedance state.

(2) When Data Bus Control Enable Signal BE is Set to "L":

Irrespective of the data bus active signal BA, the output signal of the NAND 7 is "H." Therefore, when the output enable signal /OE is "L," the control signal /CN issued from the AND 8 goes to "L," causing the output data DO to be sent to the bi-directional bus 1 through the three-state buffer 2. On the other hand, when the output enable signal /OE is "H," the control signal /CN goes to "H." This causes the bi-directional bus 1 to enter the high-impedance state.

As described above, the interface circuit 19 of the second embodiment has logical gates (inverter 6, NAND 7, and AND 8) for generating the control signal /CN associated with the three-state buffer 2 for outputting the output data DO to the bi-directional bus 1 based on the data bus active signal BA and the data bus control enable signal BE, which can be set by the register within the control apparatus, in addition to the output enable signal /OE. Thus, the state of the bi-directional bus, when it is inactive, can be set to "H," "L," or high-impedance state in an arbitrary manner in accordance with the specifications of a peripheral device connected to the bi-directional bus 1.

It should be noted that the logical levels of the output enable signal /OE, data bus active signal BA and data bus control enable signal BE are merely illustrative, and reverse logical levels may be used. The configurations of the logical gates must be modified in accordance with the logical levels of these signals.

This application is based on a Japanese Patent Application No. 2005-92304 filed on Mar. 28, 2005 and the entire disclosure thereof is incorporated herein by reference.

What is claimed is:

1. An interface circuit comprising:
    a three-state buffer for outputting output data applied to an input thereof to a bi-directional bus when a control signal is at a first level, and bringing an output thereof into a high-impedance state when the control signal is at a second level;
    a buffer for fetching a signal on said bi-directional bus as input data; and
    a logical gate for outputting the control signal at the first level when an output enable signal is in an active state or when said hi-directional bus is enabled by a bus control signal which is set in accordance with an output state of a device connected to said bi-directional bus and a bus access signal indicates that said bi-directional bus is not in use, and outputting the control signal at the second level when the output enable signal is in an inactive state and said bi-directional bus is not enabled by the bus control signal or when the output enable signal is in an inactive state and the bus access signal indicates that said bi-directional bus is in use.

2. The interface circuit according to claim 1, wherein said bus control signal is set by a register or a manual switch.

3. The interface circuit according to claim 1 which conforms to ATA standard.

* * * * *